United States Patent [19]
Donohoe et al.

[11] Patent Number: 5,985,375
[45] Date of Patent: Nov. 16, 1999

[54] METHOD FOR PULSED-PLASMA ENHANCED VAPOR DEPOSITION

[75] Inventors: Kevin G. Donohoe; Gurtej S. Sandhu, both of Boise, Id.

[73] Assignee: Micron Technology, Inc., Boise, Id.

[21] Appl. No.: 09/146,640

[22] Filed: Sep. 3, 1998

[51] Int. Cl.$^6$ ...................................................... C08F 2/46
[52] U.S. Cl. ........................ 427/492; 427/58; 427/248.1; 427/255.6; 427/535; 427/569; 427/585; 437/225
[58] Field of Search .................................. 427/58, 248.1, 427/255.6, 492, 535, 569, 585; 437/225

[56] References Cited

U.S. PATENT DOCUMENTS

| | | | |
|---|---|---|---|
| 3,940,506 | 2/1976 | Heinecke ................................. | 466/570 |
| 4,073,669 | 2/1978 | Heinecke et al. ....................... | 681/664 |
| 4,328,261 | 5/1982 | Heinecke et al. ....................... | 199/799 |
| 4,433,012 | 2/1984 | Heinecke et al. ....................... | 427/252 |
| 4,460,618 | 7/1984 | Heinecke et al. ....................... | 314/944 |
| 4,684,535 | 8/1987 | Heinecke et al. ....................... | 890/891 |
| 4,749,589 | 6/1988 | Heinecke et al. ....................... | 427/39 |
| 4,824,690 | 4/1989 | Heinecke et al. ....................... | 117/923 |
| 4,935,661 | 6/1990 | Heinecke ................................. | 879/39 |
| 5,344,792 | 9/1994 | Sandhu et al. .......................... | 437/200 |
| 5,362,526 | 11/1994 | Wang et al. ............................ | 645/999 |

OTHER PUBLICATIONS

"Preparation of Amorphous Multilayer Films by Pulsed Plasma and Photo (PPP) CVD Method", Report of the Research Laboratory of Engineering Materials, Nagatsuta, Yokohama 227, Japan, No. 14, 1989. (no month avail.).

Low–temperature pulsed plasma deposition. II. The production of novel amorphous compounds of germanium in thin film, Journal of Vacuum Science & Technology A, vol. 7, No. 3, pt. 1, pp. 1099–104, 1989. (no month avail.).

"Low temperature pulsed plasma deposition. Part I—a new technique for thin film deposition with complete gas dissociation", Vacuum, vol. 38, Nos. 8–10, pp. 627 to 63, 1988. (no month avail.).

Surface Coatings & Technology, 102(1998) 35–40, "The time Development of pulsed–DC production plasmas used for deposition of TiN" by K.S. Mogensen et al. (no month avail.).

*Primary Examiner*—Bernard Pianalto
*Attorney, Agent, or Firm*—Schwegman, Lundberg, Woessner & Kluth P.A.

[57] ABSTRACT

A novel method for pulsed-plasma enhanced chemical vapor deposition ("PPECVD") is described. A power-modulated energy waveform is provided to a gas in a reactor chamber to generate a pulsed-plasma for PPECVD. The power-modulated energy waveform is amplitude-modulated by a beat frequency caused by interfering signals. The product of the interfering signals is a continuous, amplitude modulated signal, in which a beat frequency waveform may have either a sinusoidal form or a non-sinusoidal form. Beat frequency is selected such that a characteristic thickness of a material to be deposited may or may not be not be deposited in a single period of the beat frequency.

18 Claims, 8 Drawing Sheets

METHOD FOR PULSED-PLASMA ENHANCED VAPOR DEPOSITION

TECHNICAL FIELD OF THE INVENTION

The present invention relates to pulsed-plasma enhanced vapor deposition for semiconductor processing, and more particularly relates to pulsed-plasma enhanced vapor deposition tailored to characteristic layer thickness of a film to be deposited.

BACKGROUND OF THE INVENTION

In semiconductor integrated circuit fabrication, deposition reactors employ a gas to deposit a film on a substrate. In chemical vapor deposition (CVD) process, a solid film is formed on a surface of the substrate. This film deposition occurs by a thermally activated reaction of gaseous species which are absorbed onto the surface of the substrate. However, the relatively high temperatures employed in CVD limit its applicability to certain process steps in the fabrication of semiconductor integrated circuits.

To avoid the relatively high temperatures of CVD, plasma-enhanced CVD (PECVD) was developed. Advantageously, with PECVD relatively low pressure and low temperature may be employed with relatively high electron energies with respect to heavy particle energies. This may be better understood by an understanding of a plasma.

A plasma is a collection of electrically charged particles and neutral particles. The charged particles of plasma have equal densities. In other words, the density of negatively charged particles (electrons and negative ions) is equal to the density of positively charged particles (positive ions). Plasma also comprises neutral particles or radicals. The radical is an atom or a molecule with unsatisfied chemical bonding having an equal number of electrons and protons. In a PECVD process, high electron temperatures are employed to increase the density of disassociated species within plasma. These disassociated species or radicals are available for deposition on a substrate assembly surface. Owing to a small mass, hot electrons do not create a high temperature process, as compared with a thermally activated CVD process. An enhanced supply of reactive free radicals makes deposition of high quality films possible at low temperatures as compared with a thermally activated CVD process. Moreover, high-density plasma may be employed to facilitate deposition. A high-density plasma is typically defined as having an ion-electron density on the order of $10^{10}$–$10^{13}$ ions-electrons per $cm^3$ operating at 1 mtorr, where neutral to ion ratio is on the order of 100:1 to 1:1.

However, PECVD processes are somewhat problematic with respect to depositing conductive films. Such PECVD films tend to be relatively rough, and such films have a relatively high bulk resistance (>250$\mu\Omega$-cm). To overcome limitations in the character of PECVD deposited conductive films, a pulsed-plasma-enhanced CVD (PPECVD) process was developed. In such a process, a pulsed-plasma is provided by turning power "on" and "off". PPECVD allows for depositing reacting species onto a substrate and allows for departure of by-products from a substrate. Thus, a pulsed-plasma leads to a shift in dynamic equilibrium, which alters the average density of intermediate ion species present in the reaction chamber. These reaction kinetics have been employed for controlling depositing of conductive films with desired characteristics. However, control of such pulsed-plasmas is dependent on turning plasma power "on" and "off".

It has been suggested by others, that such pulsing is inefficient with respect to power consumption and transients. It has been suggested that by using interfering frequencies, a beat frequency may be introduced which facilitates amplitude modulation of a bias or driving signal for modulated plasma generation. Such beat frequency introduction has the advantage of potentially offering more control as compared to rapidly turning a plasma on and off, and may be used for PPECVD. It would be desirable to employ such a PPECVD approach in a manner, which provides greater control of deposition for selected deposition of species and separation of heavy ion species.

SUMMARY OF THE INVENTION

The present invention provides a novel method for PPECVD. In accordance with the present invention, a power-modulated energy waveform is provided to a gas in a reactor chamber to generate a pulsed-plasma for PPECVD. The power-modulated energy waveform is amplitude-modulated by a beat frequency caused by interfering signals. The product of the interfering signals is a continuous, amplitude modulated signal, in which a beat frequency waveform may have either a sinusoidal form or a non-sinusoidal form. The non-sinusoidal waveform provides an advantage of not having to go to extreme voltage values in order to maintain a voltage level above or below a threshold level for an extended period of time.

In accordance with the present invention, there are two frequency dependent embodiments for PPECVD, namely, a high frequency embodiment and a low frequency embodiment. In the high frequency embodiment, beat frequency is greater than film deposition rate divided by a characteristic layer thickness. In the high frequency embodiment, beat frequency is selected such that a characteristic layer thickness may not be deposited in a single period. In the low frequency embodiment, beat frequency is selected such that a characteristic layer thickness may be deposited in a single period. In particular, a time interval above or below a threshold or median voltage may be adjusted to control deposition.

BRIEF DESCRIPTION OF THE DRAWING(S)

Features and advantages of the present invention will become more apparent from the following detailed description of the preferred embodiment(s) described below in detail with reference to the accompanying drawings where.

Reference numbers refer to the same or equivalent parts of the present invention throughout the several figures of the drawing.

DETAILED DESCRIPTION OF THE PREFERRED EMBODIMENT(S)

In a related, co-pending U.S. patent application Ser. No. 09/120,779, filed Jul. 22, 1998, to Kevin G. Donohoe, named herein, and Marvin Hagedorn, there is a detailed description of using beating to amplitude-modulate a signal employed for pulsed-plasma generation. In order to understand the present invention, an understanding of the technology described in the above-mentioned related application is necessary. Accordingly, a description of that technology is set forth herein.

DETAILED BACKGROUND OF THE INVENTION

Figure 1:
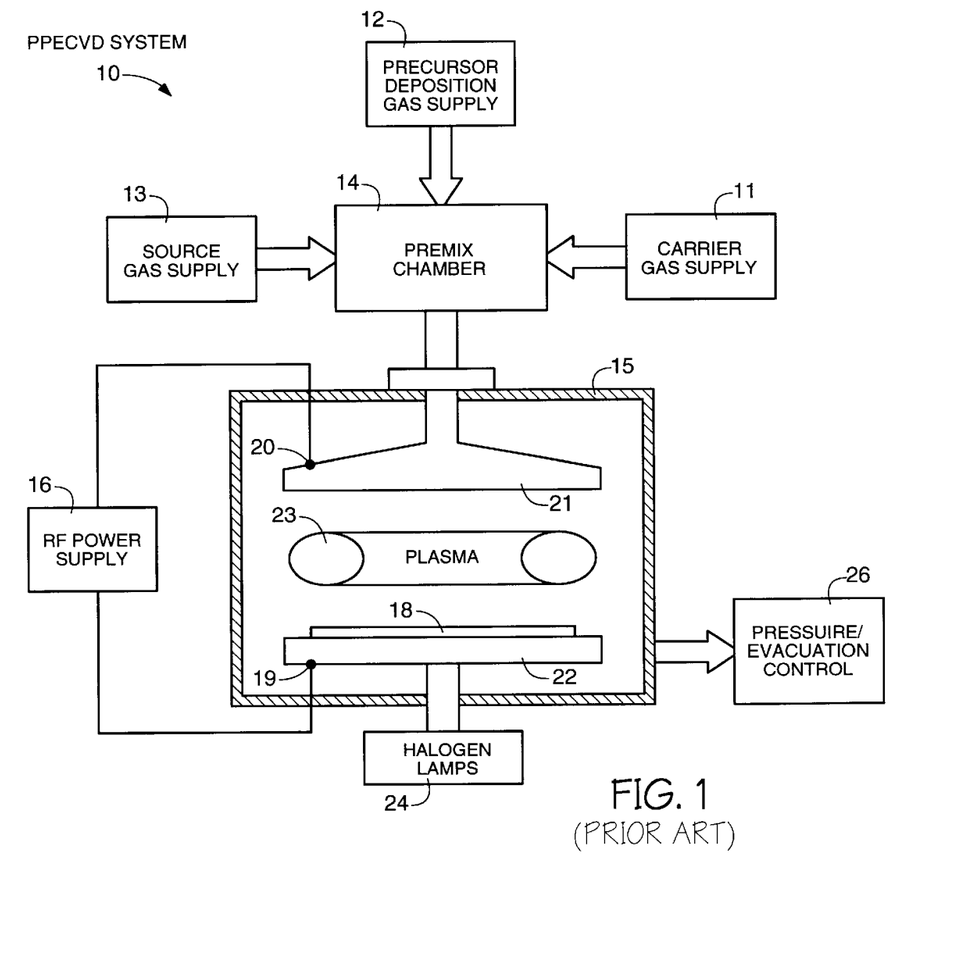
FIG. 1 is a block diagram of an exemplary portion of a PPECVD reaction chamber system of the prior art.

Referring to FIG. 1, there is shown a block diagram PPECVD system (reactor) 10 of the prior art. System 10 comprises carrier gas supply 11, precursor deposition gas supply 12, source gas supply 13, premix chamber 14, reaction chamber 15, radio frequency ("RF") power supply 16, halogen lamps 24, and pressure control and evacuation control 26. Some conventional details with respect to system 10 have been omitted to more clearly describe the present invention. Gas supplies 11–13 may be used to provide gas (plasma source material) to premix chamber 14. By "gas," it is meant a single gas or a mixture of gases. Alternatively, the gases may be mixed in-situ within reaction chamber 15, and premix chamber 14 may be replaced with a manifold or all gases may be supplied directly to chamber 15. In such an alternative embodiment, the gases may be provided directly to reaction chamber 15. Reaction chamber 15 houses showerhead 21 and susceptor (chuck) 22. A RF power supply 16 is electrically coupled to showerhead 21 and susceptor 22 through electrodes 20 and 19, respectively. Substrate assembly 18 is loaded onto susceptor 22. By "substrate assembly," it is meant a substrate (including but not limited to a bare wafer) which may have one or more patterned or unpatterned layers formed thereon or therein. Power from RF power supply 16 is applied to electrodes 20 and 19 at least in part for generating plasma 23. Plasma 23 is employed to assist chemical vapor deposition. For example, gas from chamber 14 is provided to (flowed into) reaction chamber 15 and is distributed by showerhead 21 therein. Gas is employed as a source material for generating plasma 23. Chemical constituents of plasma 23 deposit onto substrate assembly 18 to form one or more layers thereon.

Figure 2:
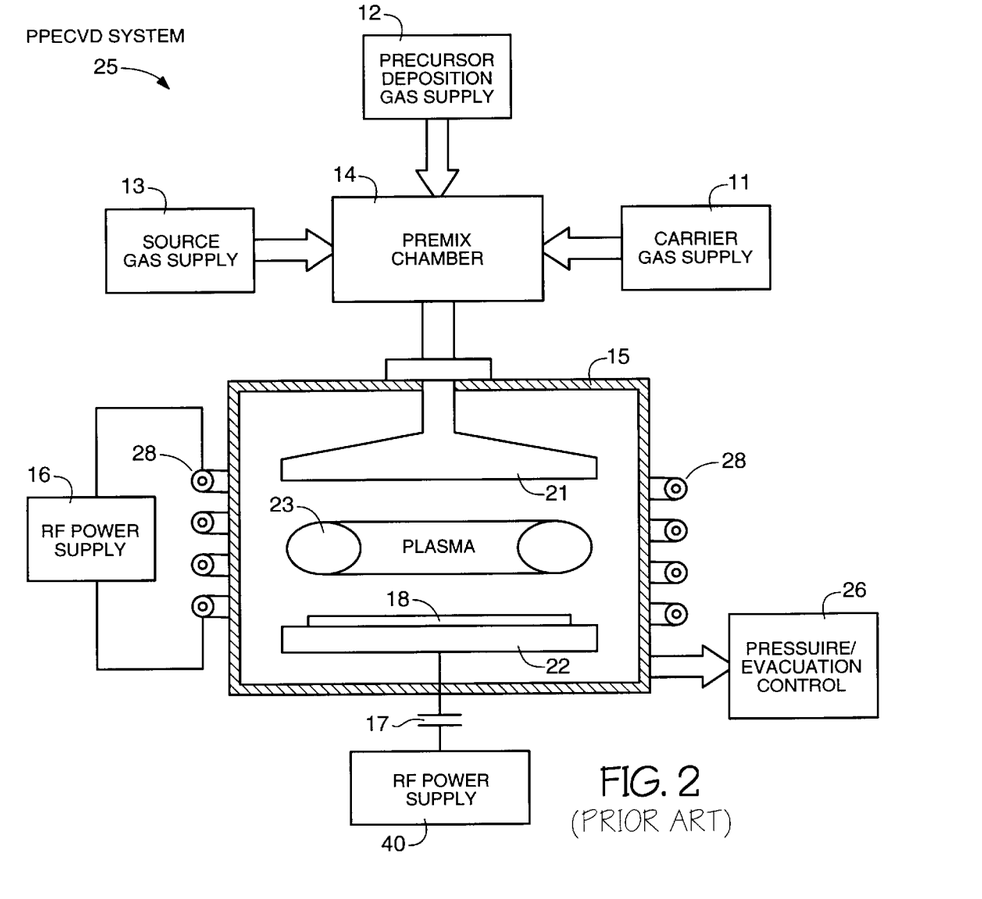
FIG. 2 is a block diagram of an exemplary portion of an alternate embodiment of a PPECVD reaction chamber system of the prior art.

Referring now to FIG. 2, there is shown a block diagram of an alternate embodiment of a PPECVD system 25 of the prior art. Many elements of system 25 are similar to system 10 (shown in FIG. 1); however, in system 25, RF power supply 16 is inductively coupled to chamber 15 through coil 28, and susceptor 22 is coupled to a second RF power supply 40 through decoupling capacitor 17. In this configuration, power from RF power supply 16 is applied to coil 28 to induce generation of plasma 23 by inductive coupling. Power from RF power supply 40 is applied to susceptor 22 through decoupling capacitor 17. This "bottom power" from RF power supply 40 is employed to enhance deposition of chemical constituents from plasma 23 onto substrate assembly 18.

Figure 3:
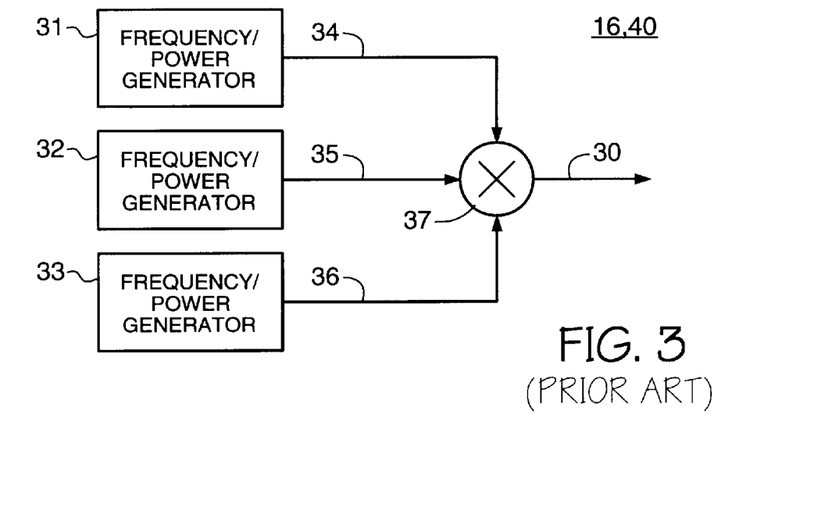
FIG. 3 is a block diagram of an exemplary portion of an embodiment of a RF power supply of the prior art.

Referring now to FIG. 3, there is shown a block diagram of exemplary circuitry utilized in RF power supply 40 or RF power supply 16 of the prior art. RF power supply 40 and RF power supply 16 include two or more frequency generators 31, 32, and 33. Outputs 34, 35, and 36 generators 31, 32, and 33, respectively, are provided to converter or mixer 37. Mixer 37 combines output signals 34, 35, 36, and 38 to define output signal 30 having a beat frequency component.

Figure 4:
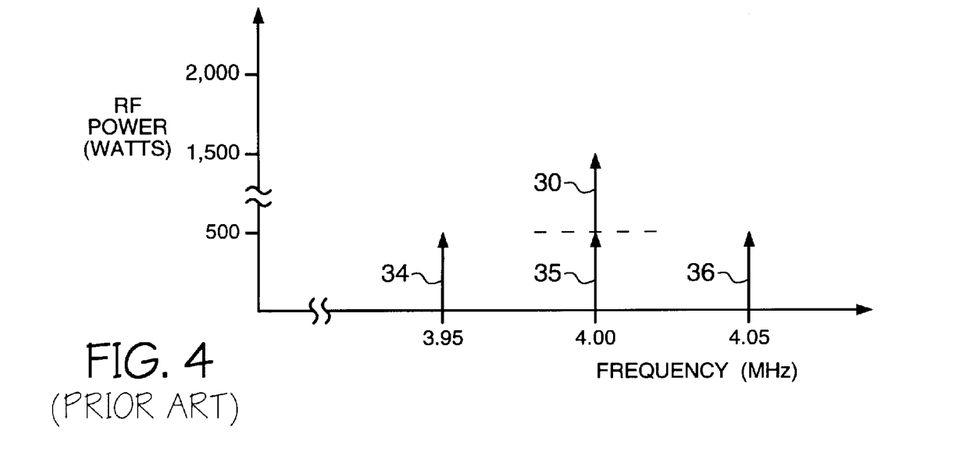
FIG. 4 is a graphical representation of frequency and power distribution for discrete values of a RF signal of the prior art.

Two or more generators 31, 32, and 33 may be employed where each provides a discrete frequency and a discrete power level (excluding zero hertz or volts), as illustratively shown in FIG. 4.

In FIG. 4 there is shown a graphical representation of signal distribution for discrete values of RF signals 34, 35, and 36 of the prior art. Signals 34, 35, and 36 may be set at a same or differing powers; however, selected frequencies for signals 34, 35, and 36 must produce beating when mixed. Thus, at least two signals need to have different frequencies. By way of example and not limitation, a frequency of 3.95 MHz and a power of 500 watts may be employed for signal 34. Similarly, by way of example, signal 35 may be set at a frequency of 4.00 MHz and a power of 500 watts, and signal 36 may be set at a frequency of 4.05 MHz and a power of 500 watts. The resulting combined output, namely signal 30, will have a power that is a combination of the individual powers (e.g., 1500 watts). Over time, frequencies will overlap one another, and interference between such overlapping frequencies will provide beat frequencies. Such beating will power-modulate a signal waveform, as is described elsewhere herein in more detail.

Figure 5A:
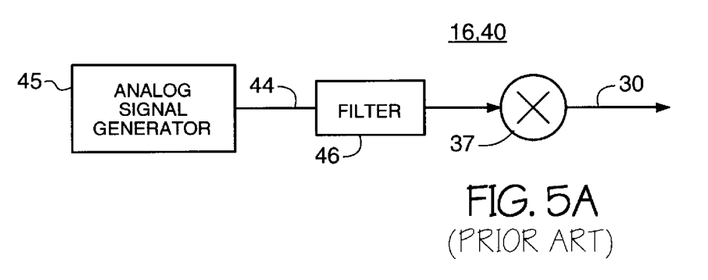
FIG. 5A is a block diagram of a generator for a RF power supply of the prior art

Alternatively, one analog signal generator may provide a plurality of frequencies. Referring to the block diagram of FIG. 5A, signal generator 45 outputs a plurality of frequencies and powers in the form of signal 44. A filter 46 may be employed to block out one or more unwanted frequencies of signal 44. Notably, one or more filters 46 may be employed to filter signal 44.

Figure 5B:
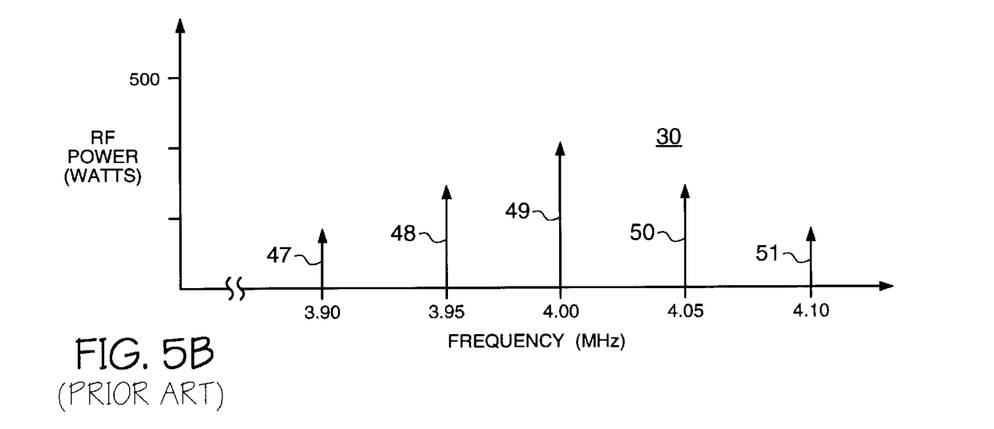
FIG. 5B is a graphical representation of frequency and power distribution for a distribution of values of a RF signal from the generator of FIG. 5A.

In FIG. 5B, there is shown a graphical representation of signal distribution for RF signal 44 from signal generator 45. Signal 44 has a component of a primary frequency 49, as well as secondary and tertiary frequency components 48, 50 and 47, 51, respectively, which vary by frequency increments in both decreasing and increasing directions. The result is a frequency distribution rather than a set frequency. By way of example and not limitation, a primary frequency 49 of 4.00 MHz was selected with frequency increments of 0.05 MHz for secondary frequencies 48 and 50, and tertiary frequencies 47 and 51. Thus, a single generator 45 in RF power supply 16 or 40 may be employed to produced a power-modulated waveform.

With renewed reference to FIGS. 3 and 4, if only generators 31 and 32 are used, and if signal 34 is of the form A sin $\omega_1 t$ and signal 35 is of the form B sin $\omega_2 t$, in the instance where mixer 37 comprises a multiplier, then signal 30 is of the form $(AB/2)(\cos(\omega_1 t - \omega_2 t)\cos(\omega_1 t + \omega_2 t))$. However, frequencies and powers used for plasma generation tend to be too high for most multipliers; consequently, a summing junction is preferred. Where mixer 37 comprises a summer, a result similar to that shown for a multiplier may be achieve by adding or subtracting voltage components of separate signals of different frequencies, as is described in detail elsewhere herein.

While the prior art has been explained in terms of mixing power signals prior to providing same to plasma source matter, it should be understood that such mixing of signals may occur in-situ or contemporaneously with plasma generation in a chamber. In which case, mixer 37 may be omitted.

Figure 6:
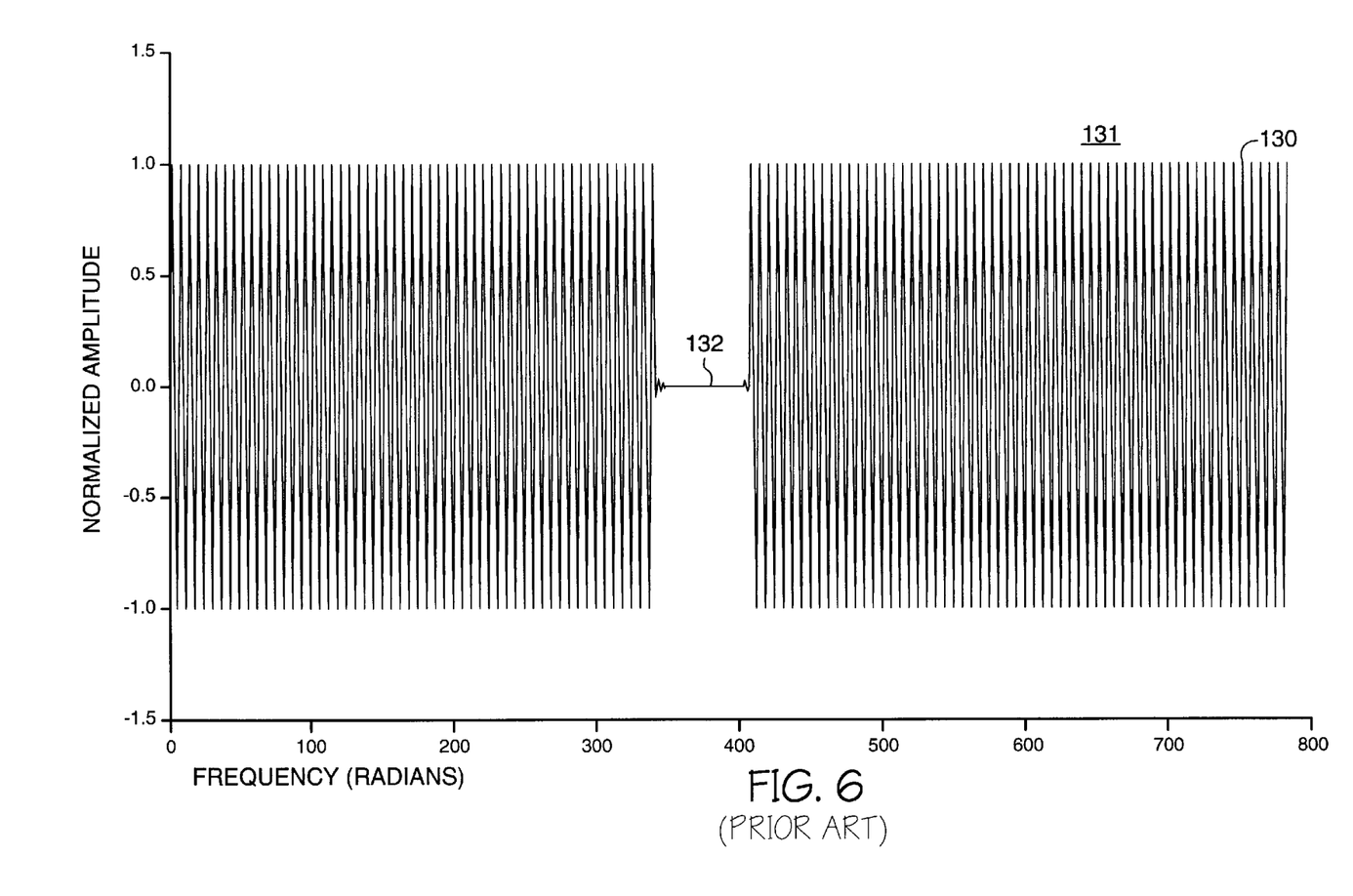
FIG. 6 is a graphical representation of a fundamental frequency operation of the prior art.

Referring to FIG. 6, there is shown a graphical representation of a non-amplitude-modulated single 131 of the prior art. Amplitude 130 of signal 131 has been normalized to a plus or minus one volt range. Signal 131, namely, sin ωt, for ω=2πf, has a fundamental frequency, f. In the prior art, power to signal 131 was turned on and off to pulse the plasma. Thus, signal 131 of the prior art is a discontinuous signal, as graphically illustrated by segment 132.

Figure 7:
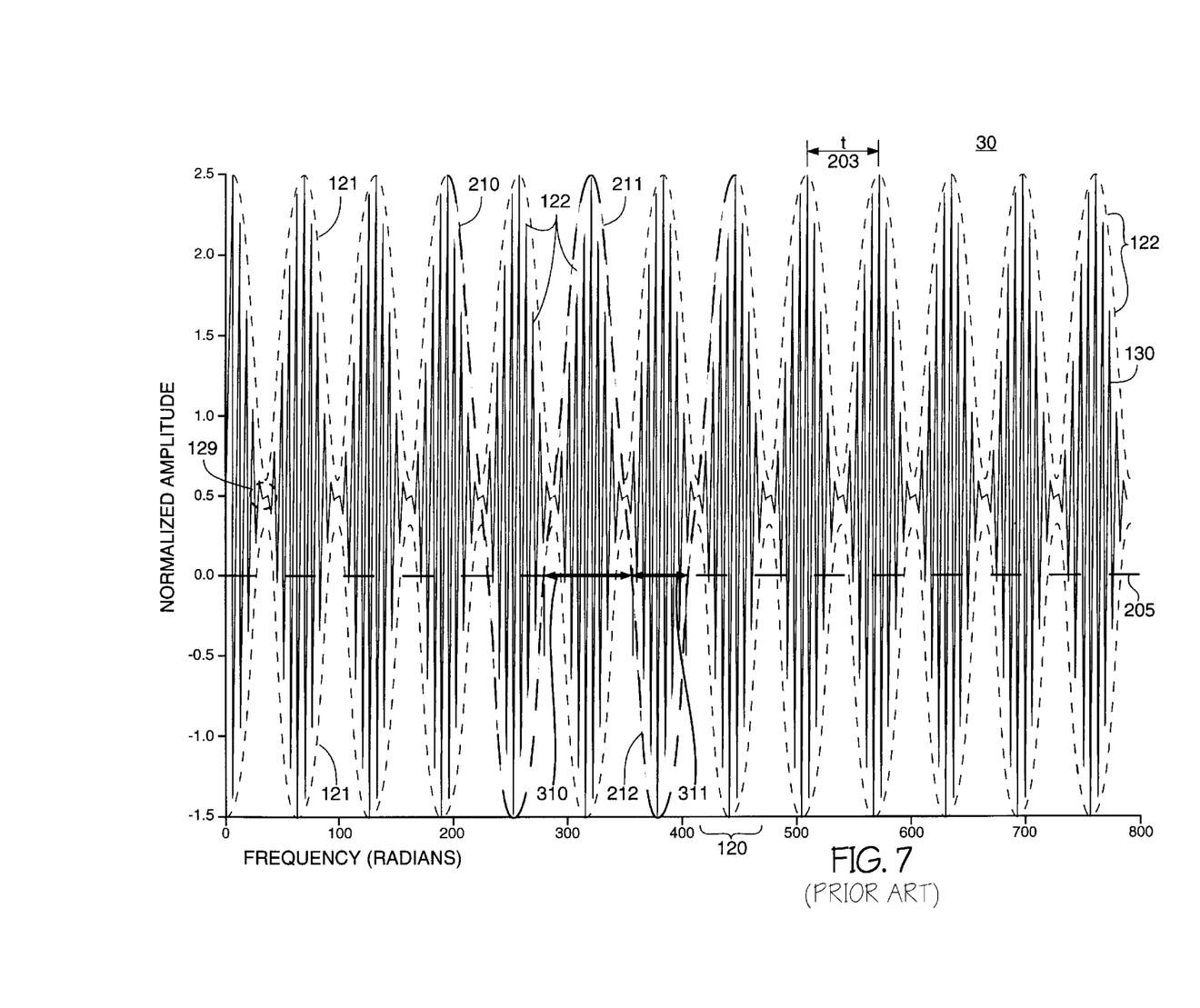
FIG. 7 is a graphical representation of an embodiment of an RF signal of the prior art.

Referring to FIG. 7, there is shown a graphical representation of a voltage signal 30 of the prior art. For clarity, amplitude of signal 30 has been normalized, so no units (e.g., volts) are expressed. Signal 30 is a voltage component summation of signals from power supply 40 or 16. Amplitude modulation is occurring as seen by differences in amplitudes is 122. As indicated by slope of signal 30 through mid-point crossings 129, a plasma pulsing signal may be provided by a continuous signal.

As is graphically illustrated, envelopes 120 are formed. Signals combined by supply 40 or 16 will have additive and destructive interference owing to differences in frequencies. In other words, beating is occurring as seen by beat frequency 121. In this example, signal 30 may be mathematically expressed as:

$$\sin \omega t + 0.5 \sin 0.9\omega t + 0.5 \sin 1.1\omega t. \quad (1)$$

By way of example and not limitation, signals 34, 36 may be attenuated in amplitude by fifty percent (50%) with respect to signal 35, and signals 34, 36 may each be shifted by ten percent (10%) in frequency to respective opposing sides of a fundamental frequency of signal 35. It should be noted that envelopes 120 may be adjusted by altering amplitude modulation index. Signal 30 amplitude modulation index or degree of modulation is unity in this example.

Beating is occurring as seen by beat frequency 121. This beating introduces a RF component of lower frequency than that of the constituent driving frequencies. In this embodiment, beat frequency 121 is approximately one-tenth of the fundamental frequency (f), or approximately ten times fewer cycles per second than f.

Low frequency beating 121 facilitates modulating or pulsing a plasma. Beat frequency 121 is obtained from and relatively low with respect to frequency of driving signal 130. Envelopes 120 represent low frequency pulsing for providing a pulsed-plasma. In other words, plasma may be pulsed with envelopes 120. Notably, this facilitates amplitude modulation of signal 30 for providing a pulsed-plasma. Moreover, by beating, an amplitude-modulated plasma pulsing signal is achieved as a continuous signal, in contrast to a discontinuous signal caused by turning power on and off.

DETAILED DESCRIPTION OF THE INVENTION

In accordance with the present invention, by controlling waveform 210, film properties may be controlled. This may be accomplished by controlling frequency of waveform 210. A portion 211 of waveform 210 is above zero voltage line 205 for time 310, and a portion 212 of waveform 210 is below zero voltage line 205 for time 311. With respect to application of power from a "top power" supply such as RF power supply 16, deposition is more likely to occur during at least some part of portion 211 of beat frequency waveform 210, and conditioning is more likely to occur during at least some part of portion 212 of waveform beat frequency 210. Therefore, by controlling time above or below a threshold voltage for depositing or conditioning, film thickness and condition may be controlled.

Figure 8:
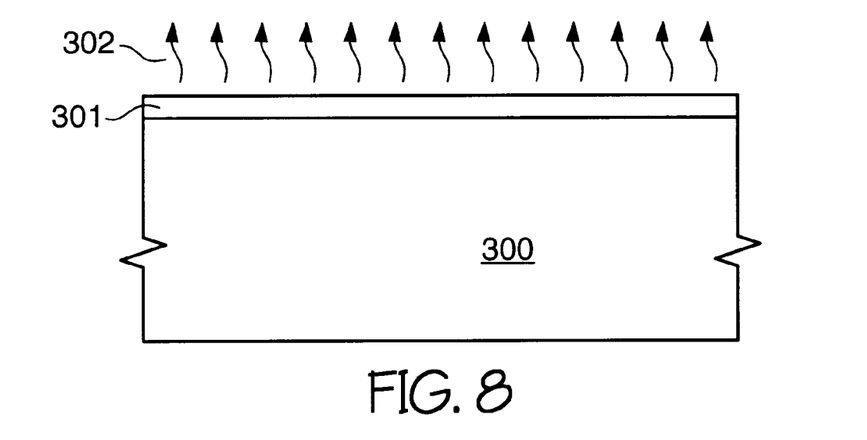
FIG. 8 is a cross-sectional view of an exemplary portion of a layer formed in accordance with the present invention.
Figure 9:
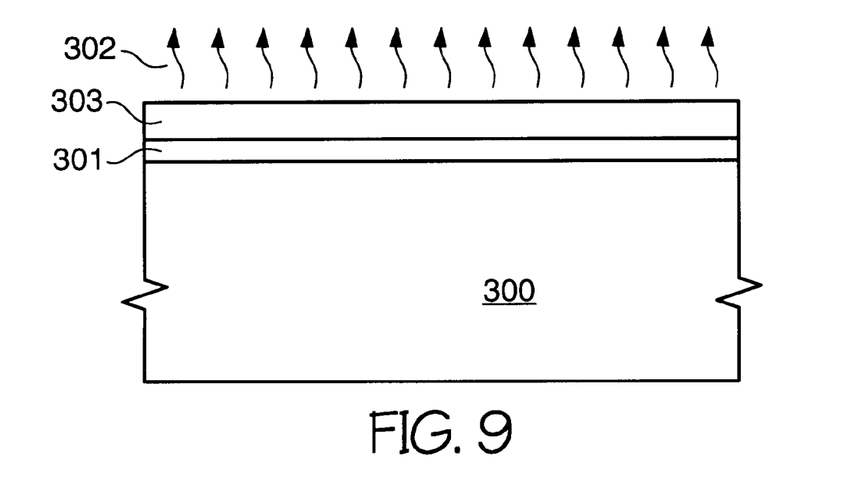
FIG. 9 is a cross-sectional view of an exemplary portion of layers formed in accordance with the present invention.

Referring to FIGS. 8 and 9, there are shown cross-sectional views of layers formed in accordance with the present invention. Substrate 300 is provided in a reaction chamber. Substrate 300 may be a silicon (Si) wafer. A first layer 301 is deposited for at least a portion of deposition interval 310 (shown in FIG. 7). Layer 301 may next be treated for at least a portion of treatment interval 311 (shown in FIG. 7). During treatment interval 311 (shown in FIG. 7), unwanted matter 302 may be expelled from layer 301. Conditioning layer 301 may reduce resistance, relieve stress, re-orient crystalline structure, and like benefits. Additionally, polymers may undergo changes in the degree of cross-linking in a film. During a subsequent deposition interval, layer 303 may be formed on layer 301. Layer 303 may then be conditioned during a subsequent treatment interval. In this manner, a plurality of conditioned layers may be formed to provide a film.

Figure 10:
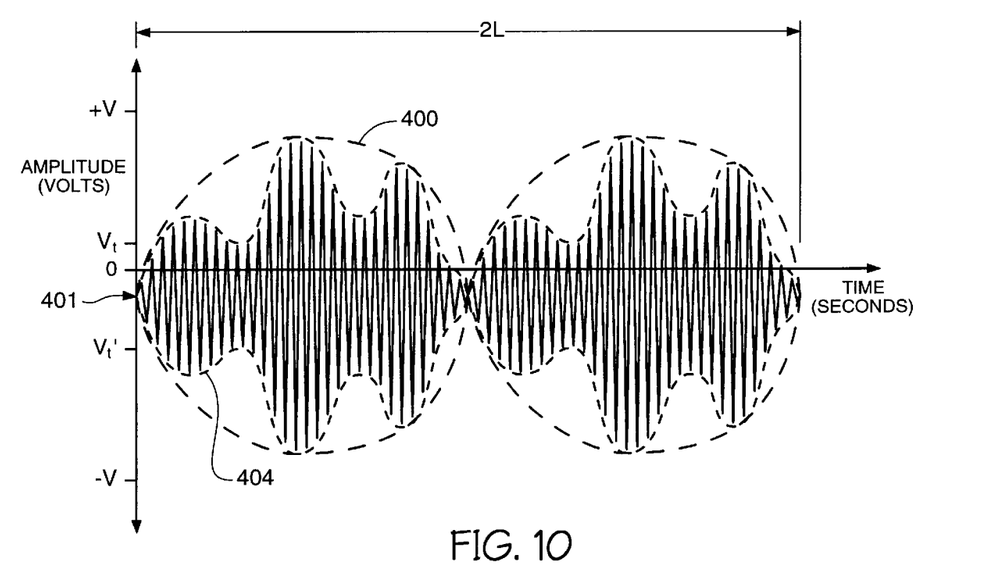
FIG. 10 is a waveform diagram of an exemplary portion of an embodiment of a power-modulated waveform in accordance with the present invention.

In FIG. 7, a sinusoidal waveform 210 is shown to describe discrete deposition and conditioning events. In FIG. 10, there is shown a diagram of an exemplary portion of an embodiment of a generalized power-modulated waveform 404 in accordance with the present invention. Notably, power-modulated waveform 404 is not sinusoidal.

Waveform 404, may be described by a Fourier Series, namely, $$f(x) = a_0/2 + \sum_{n=1}^{\infty}(a_n \cos(n\pi x/L) + b_n \sin(n\pi x/L)), \quad (2)$$

where f(x) is a bounded periodic function of period 2L, and where f(x) satisfies the Dirichlet conditions of: in any period, f(x) is continuous, except possibly for a finite number of jump discontinues; and, in any period, f(x) has only a finite number of maxima and minima. The values $a_n$ (including $a_o$) and $b_n$ are mathematically expressed as:

$$a_n = (1/L)\int_{-L}^{L} f(x)\cos(n\pi x/L)dx, n = 0, 1, 2, 3, \ldots; \quad (3)$$

$$b_n = (1/L)\int_{-L}^{L} f(x)\sin(n\pi x/L)dx, n = 1, 2, 3, \ldots. \quad (4)$$

Beat frequency 400 and waveform 404 each have a period 2L and a median voltage level 401. For a deposition threshold voltage $V_t$ and a conditioning voltage threshold voltage $V_t'$, and for time $t_1$ an interval of time above $V_t$ and time $t_2$ an interval of time below $V_t'$, a mathematical relationship between period 2L, and times $t_1$ and $t_2$ may be expressed as:

$$2L \geq t_1 + t_2. \quad (5)$$

It should be understood that deposition and/or conditioning may occur at any time within period 2L. However, deposition is more likely to occur during $t_1$ and conditioning is more likely to occur during $t_2$ with respect to power modulation owing to application of a "top" power source, such as from RF power supply 16.

It should be appreciated that a non-sinusoidal waveform, such as waveform 404, allows voltage to be maintained above or below a threshold voltage. In contrast to a sinusoidal waveform, waveform 404 does not necessarily use extreme voltage values to maintain voltage above or below a threshold level. As period, 2L, is inversely proportional to beat frequency 400, in accordance with the present invention, deposition not only depends at least in part on deposition threshold voltage, but also depends at least in part on beat frequency.

In low frequency operation, a characteristic layer thickness ($F_1$) may be deposited during a period 2L. All or some portion of $F_1$ is deposited during $t_1$, and none or some of $F_1$ is deposited during $t_2$. $F_1$ will have a first property ($P_1$) after $t_1$, and a second property $P_2$ after $t_2$. The net effect is a cumulative alteration over a number of periods 2L In high frequency operation, there is not sufficient time within a period 2L to deposit a characteristic layer thickness. A characteristic layer or characteristic layer thickness is dependent on material to be deposited. Characteristic layer thickness is dependent on whether an amorphous solid, a crystalline solid (including either a polycrystalline solid or a single crystalline solid), or an organic polymer is to be deposited. Characteristic layer thickness for amorphous solids is equivalent to thickness of a monolayer (i.e., a one atom thick layer) of the material. Characteristic layer thickness for crystalline solids is a lattice dimension thickness. Characteristic layer thickness for complex structures, such as polymer films, is similar in order of magnitude to the bond lengths of the chemical bonds in the material. For example, a CF polymer characteristic layer thickness is approximately the size of the C—C or C—F bonds.

TABLE I

| Bond | Approximate Bond Length (Å) |
|---|---|
| C—H | 1.0–1.1 |
| C—C | 1.4–1.5 |
| C—F | 1.3–1.4 |
| C—N | 1.3–1.5 |
| C=O | 1.2 |
| C—O | 1.2 |
| C—Cl | 1.7 |

By way of example and not limitation, suppose a film has an amorphous structure, then the characteristic layer is equivalent to a monolayer (one atom thick layer) of the material. If it takes 0.01 seconds to deposit five angstroms (Å) of material (e.g., a one atom thick layer or monolayer), then a monolayer may not be deposited within each period 2L if frequency is greater than 100 hertz (Hz). Where frequency is too high to deposit a monolayer within a period, deposition takes place cumulatively over a number of periods 2L. Thus, for any interval $t_1$ and/or $t_2$ there may or may not be any deposition. Notably, conditioning of a deposited material may still take place during $t_1$ and/or $t_2$ with or without deposition.

In other words, beat frequency is selected to be greater than the ratio of a desired deposition rate divided by a characteristic layer thickness. By way of example and not limitation, if a monolayer for a amorphous material to be deposited is 5 Å thick, and if the material is deposited at 2,000 Å/s, then a threshold beat frequency is 400 Hz. If beat frequency is selected to be greater than 400 Hz, a monolayer may be formed over a number of periods 2L. In such a high frequency environment, $F_1$ is deposited over more than one period. So, in more than one interval $t_1$ and $t_2$, $F_1$ is formed. As F! is formed, its property may be altered during each interval $t_1$ and $t_2$ with a cumulative alteration over a number of periods 2L. This allows for depositing one or more layers of a conductive, an insulative, or a semiconductive material in a controlled manner.

Figure 11:
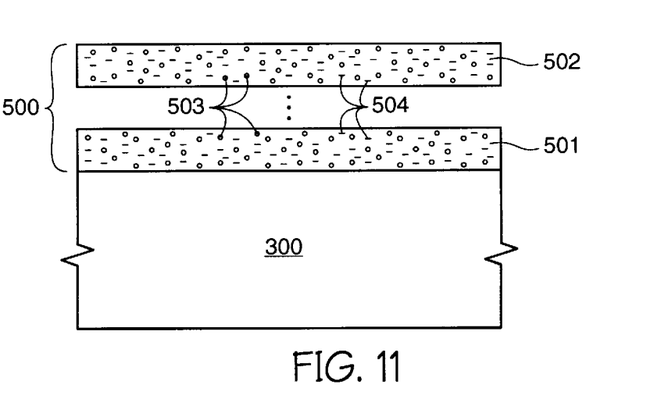
FIG. 11 is a cross-sectional view of an exemplary portion of a film formed in accordance with the present invention.

Referring to FIG. 11, there is shown a cross-sectional view of an exemplary portion of an amorphous film 500 formed on substrate 300 in accordance with an embodiment of the present invention. Film 500 may comprise one or more monolayers. Monolayer 501 is formed over a number of periods 2L. Accordingly, particles 503 and 504, which form monolayers 501 and 502, are deposited over a number of time intervals, t. A combination of monolayers form film 500. Though film 500 is described in terms of depositing an amorphous film, it should be apparent to those of ordinary skill that film 500 may be a crystalline solid or a polymer material, as described elsewhere herein.

It should be understood that the aforementioned embodiments are described in terms of application of a "top" power, namely application of modulating power from RF power supply 16 (shown in FIG. 2). However, a "bottom" power, namely application of modulating power from RF power supply 40 (shown in FIG. 2), may be employed in accordance with the present invention. Notably, if signal 30 is provided by RF power supply 40, then deposition is dominant below a median voltage, and conditioning is dominant above a median voltage.

The present invention has been particularly shown and described with respect to certain preferred embodiment(s). However, it will be readily appreciated to those of ordinary skill in the art that a wide variety of alternate embodiments, adaptations or variations of the preferred embodiment(s), and/or equivalent embodiments may be made without departing from the intended scope of the present invention as set forth in the appended claims. Accordingly, the present invention is not limited except as by the appended claims.

What is claimed is:

1. A method for providing a plasma for pulsed-plasma enhanced chemical vapor deposition, comprising:

providing a plasma reactor chamber;

flowing a gas into said plasma reactor chamber;

providing a power signal, said power signal being modulated by beating to provide a non-sinusoidal amplitude-modulated waveform;

applying energy from said power signal to said gas;

generating said plasma in response to application of said energy;

depositing a film using said plasma; and conditioning said film using said plasma.

2. A method for providing a plasma for pulsed-plasma enhanced chemical vapor deposition of a substance, comprising:

providing a plasma reactor chamber;

flowing a gas into said plasma reactor chamber;

providing a power signal, said power signal being modulated by a beat frequency, said beat frequency greater than a deposition rate of said substance divided by a characteristic layer thickness of said substance;

applying energy from said power signal to said gas;

generating said plasma in response to application of said energy;

depositing a film using said plasma; and conditioning said film using said plasma.

3. A method for providing a plasma for pulsed-plasma enhanced chemical vapor deposition of a substance, comprising:

providing a plasma reactor chamber;

flowing a gas into said plasma reactor chamber;

providing a power signal, said power signal being modulated by a beat frequency, said beat frequency selected to allow a characteristic layer of said substance to be deposited in a period of said beat frequency;

applying energy from said power signal to said gas;

generating said plasma in response to application of said energy;

depositing a film using said plasma; and conditioning said film using said plasma.

4. A method for pulsed-plasma enhanced chemical vapor deposition of a substance, comprising:

providing a reaction chamber;

providing a substrate assembly in said reaction chamber;

supplying at least one plasma source material in said reaction chamber;

supplying energy from a continuous, amplitude-modulated, non-sinusoidal signal to said reaction chamber;

using said energy and from said plasma source material to generate a plasma in said reaction chamber; and depositing at least a portion of a film on said substrate assembly.

5. A method for depositing a film, comprising:

providing a reaction chamber;

providing a gas in said reaction chamber;

providing a substrate assembly surface exposed to said gas in said reaction chamber;

providing a amplitude-modulated energy to said gas, said amplitude-modulated energy having a waveform, said waveform defined at least in part by a period and at least in part by a median voltage, said period comprising a first time interval above said median voltage and a second time interval below said median voltage;

controlling said first time interval and said second time interval to adjust thickness and condition of said film;

generating a power-modulated plasma in response to interaction between said gas and said amplitude-modulated energy; and depositing said film on said substrate assembly surface in response to said power-modulated plasma.

6. A method, as in claim 5, wherein said film has a first property after said first interval and a second property after said second interval.

7. A method for depositing a film, comprising:

providing a plasma reaction chamber;

providing a gas in said reaction chamber;

providing a substrate assembly surface exposed to said gas in said reaction chamber;

amplitude modulating energy to provide a power-modulated signal;

coupling said power-modulated signal to said gas in said reaction chamber to generate a plasma, said power-modulated signal having at least one period, said period having a first time interval and a second time interval, said period greater than the time required to deposit a characteristic layer of said film; and using said plasma to deposit said film on said substrate assembly surface.

8. A method, as in claim 7, wherein said film deposition occurs at least in part during said first time interval.

9. A method, as in claim 7, further comprising conditioning said film at least in part during said second time interval.

10. A method for depositing a film, said film deposited on a substrate, the method comprising:

providing a plasma reaction chamber;

providing a gas in said reaction chamber;

providing the substrate in said reaction chamber;

providing an amplitude modulated signal;

providing energy from said amplitude-modulated signal to said gas in said reaction chamber to generate a power-modulated plasma, said energy defined at least in part by a median voltage and a beat frequency, said beat frequency having a period, said period having a first time interval above said median voltage and a second time interval below said median voltage, said period less than the time required to deposit a characteristic layer of said film; and using said power-modulated plasma to deposit said film on said substrate.

11. A method, as in claim 10, wherein said film is an insulative film.

12. A method, as in claim 10, wherein said film is a conductive material.

13. A method, as in claim 10, wherein said film is a semiconductive material.

14. A method, as in claim 10, wherein said characteristic layer is a monolayer of said film.

15. A method, as in claim 10, wherein said characteristic layer has a thickness defined by lattice dimension of said film.

16. A method, as in claim 10, wherein said film is a polymer film.

17. A method, as in claim 16, wherein said characteristic layer has a thickness defined by a bond length.

18. A method for providing a pulsed-plasma comprising:

providing a reaction chamber;

providing a plasma source material in said reaction chamber;

providing at least one power supply operatively coupled to said reaction chamber, said at least one power supply providing a power signal by:

amplitude modulating an analog signal by beating, said analog signal enveloped in a non-sinusoidal waveform; and supplying energy from said power signal to said plasma source material in said reaction chamber; and generating said pulsed-plasma in response to interaction of said energy with said plasma source material.

* * * * *